(12) United States Patent
Qiao et al.

(10) Patent No.: US 10,410,960 B1
(45) Date of Patent: Sep. 10, 2019

(54) PARALLEL SEAM WELDING LEADLESS CERAMIC PACKAGE

(71) Applicant: THE 13TH RESEARCH INSTITUTE OF CHINA ELECTRONICS TECHNOLOGY GROUP CORPORATION, Shijiazhuang, Hebei (CN)

(72) Inventors: Zhizhuang Qiao, Shijiazhuang (CN); Linjie Liu, Shijiazhuang (CN); Xin F. Zheng, Shijiazhuang (CN)

(73) Assignee: THE 13TH RESEARCH INSTITUTE OF CHINA ELECTRONICS TECHNOLOGY GROUP CORPORATION, Shijiazhuang, Hebei (CN)

( * ) Notice: Subject to any disclaimer, the term of this patent is extended or adjusted under 35 U.S.C. 154(b) by 0 days.

(21) Appl. No.: 16/314,543

(22) PCT Filed: Aug. 28, 2017

(86) PCT No.: PCT/CN2017/099263
§ 371 (c)(1),
(2) Date: Dec. 31, 2018

(87) PCT Pub. No.: WO2018/001390
PCT Pub. Date: Jan. 4, 2018

(30) Foreign Application Priority Data

Jun. 30, 2016 (CN) .......................... 2016 1 0501849

(51) Int. Cl.
*H01L 23/498* (2006.01)
*B23K 9/02* (2006.01)
*H01L 23/047* (2006.01)

(52) U.S. Cl.
CPC .......... *H01L 23/49805* (2013.01); *B23K 9/02* (2013.01); *H01L 23/047* (2013.01)

(58) Field of Classification Search
None
See application file for complete search history.

(56) References Cited

U.S. PATENT DOCUMENTS

| 5,864,092 A | * | 1/1999 | Gore | ................. H01L 23/49805 |
|---|---|---|---|---|
| | | | | 174/260 |
| 2005/0278946 A1 | * | 12/2005 | Tanielian | ................ H01L 23/04 |
| | | | | 29/855 |
| 2015/0061094 A1 | | 3/2015 | Fan | |

FOREIGN PATENT DOCUMENTS

| CN | 104051352 | 9/2014 |
|---|---|---|
| CN | 104425400 | 3/2015 |

(Continued)

OTHER PUBLICATIONS

International Search Report issued in International Application No. PCT/CN2017/099263, dated Dec. 8, 2017, 4 pages.

*Primary Examiner* — Jack S Chen
(74) *Attorney, Agent, or Firm* — Hamre, Schumann, Mueller & Larson, P.C.

(57) ABSTRACT

The application discloses a parallel seam welding leadless ceramic package, including a ceramic, a sealing ring and a metal cover plate; a back surface of the ceramic is provided with a back grounding metal pattern, and the back grounding metal pattern is provided with several outwardly protruding grounding terminals, a RF signal transmission pad is disposed between every two adjacent grounding terminals, the front grounding metal pattern and the back grounding metal pattern are interconnected by the internal and/or external metallized interconnection holes, the front grounding line and the back grounding metal pattern is interconnected by the internal or external metallized interconnection holes, and the RF signal transmission lines are interconnected to the RF signal transmission pad by a separated external and/or external metallized interconnection hole.

6 Claims, 3 Drawing Sheets

(56) References Cited

FOREIGN PATENT DOCUMENTS

| | | |
|---|---|---|
| CN | 105977215 | 9/2016 |
| CN | 205723494 | 11/2016 |

\* cited by examiner

PARALLEL SEAM WELDING LEADLESS CERAMIC PACKAGE

CROSS-REFERENCE TO RELATED APPLICATION

This application is the national stage application of PCT International Application No. PCT/CN2017/099263, with an international filing date of Aug. 28, 2017 designating the U.S., and claims priority to Chinese Patent Application No. 2016105018496, filed on Jun. 30, 2016, the contents of which being incorporated herein by reference.

TECHNICAL FIELD

The present application relates to the technical field of semiconductor packaging devices, and more particularly to a parallel seam welding leadless ceramic package.

BACKGROUND TECHNOLOGY

With the development of modern wireless communication technology, the microwave radio frequency (RF) systems are required to develop toward higher frequency, higher speed and wider frequency bands. Therefore, as the core component of the microwave RF systems, the monolithic microwave integrated circuit (MMIC) and its packaging technology are also face new challenges. An ideal MMIC package not only requires a strong mechanical structure to protect the circuit from exposure to the external environment, but also ensures the integrity of microwave signal and electrical signal. For high-power MMICs, the package requires good heat dissipation potential.

The RF performance of the traditional ceramic quad flat non-leaded package does not completely cover the X-band, and the return loss deteriorates rapidly with the frequency, and it is difficult to eliminate the in-band resonance point. In addition, this structural package has very narrow ceramic wall, and can only be sealed with alloy solder seal method. Moreover, this sealing method is complicated, and the cost is high, which leads to high cost of the integrated circuit, and which is not conducive to the continuous reduction of the cost of the ceramic package.

SUMMARY

The technical problem to be solved by the application is to provide a parallel seam welding leadless ceramic package, the RF performance completely covers the Ku-band, the return loss and the insertion loss are low, the in-band flatness is good, there is no resonance point, and the parallel seam welding sealing process can be realized, the difficulty and cost of the sealing process are reduced, the production efficiency is improved, the high reliability and the high air tightness are ensured, and the batch application is facilitated. In order to solve above technical problem, the technical solution adopted by the application is that a parallel seam welding leadless ceramic package including: a ceramic, a sealing ring and a metal cover plate; the ceramic is a container structure with an upper end opening, the metal cover plate seals the upper end opening of the ceramic through the sealing ring; the ceramic is characterized that the upper surface has three continuous layers with gradually decreasing height from outside to inside, which are the first to third layers, respectively, the second layer is provided with several RF signal transmission lines, and each side of the RF signal transmission line is provided with a grounding line, the grounding lines are located on the first layer and the second layer, and the grounding lines on the first layer and the second layer are interconnected by internal and/or external metallized interconnection holes, the third layer is provided with a front grounding metal pattern, a back surface of the ceramic is provided with a back grounding metal pattern, and the back grounding metal pattern is provided with a number prominent outward earthing terminal, a RF signal transmission pad is disposed between every two adjacent grounding terminals, the front grounding metal pattern and the back grounding metal pattern are interconnected by the internal and/or external metallized interconnection holes, the front ground line and the back grounding metal pattern are interconnected by the internal or external metallized interconnection holes, and the RF signal transmission lines are interconnected to the RF signal transmission pad by separate external metallized interconnection holes or a combination of external metallized interconnection holes and internal metallized interconnection holes.

A further technical solution is that the RF signal transmission lines are located on the second layer and run through the ceramic to the outside of the ceramic along the second layer. the radio frequency signal transmission lines are interconnected with the RF signal transmission pads by the metallized interconnection hole on the sidewall of the ceramic.

A further technical solution is that an outer end portion of the grounding line, an outer end of the grounding terminal, and an outer end of the RF signal transmission pad are located at an edge of the ceramic.

A further technical solution is that the ceramic is an alumina ceramic, an aluminum nitride ceramic, or a low temperature co-fired ceramic.

A further technical solution is that the welding between the sealing ring and the ceramic part and between the metal cover plate and the sealing ring through parallel seam welding process.

A further technical solution is that the shape of package is rectangular.

The beneficial effect of using the above technical solutions is that through structural optimization, the side face transmission hole replaces part of the internal transmission hole, thereby the layout space of the inner core signal line, the signal hole and the transmission hole are increased, thereby more grounding holes can be added to modulate the RF performance, and the RF performance can be realized to cover the Ku-band completely, the return loss and insertion loss are low, the in-band flatness is good, and there are no resonance points, which is beneficial to the development of the integrated circuit to higher frequency and higher transmission rate.

At the same time, by optimizing the structure and replacing part of internal solid transmission holes traces with side traces, the package wall thickness can be increased under the premise of ensuring excellent RF performance, the method of the parallel seam welding sealing package can be realized; compared with other sealing methods, the difficulty and cost of the sealing process is greatly reduced by realizing parallel seam welding, the production efficiency is improved, the high reliability and the high air tightness are ensured, and the batch application is facilitated.

Figure 1:
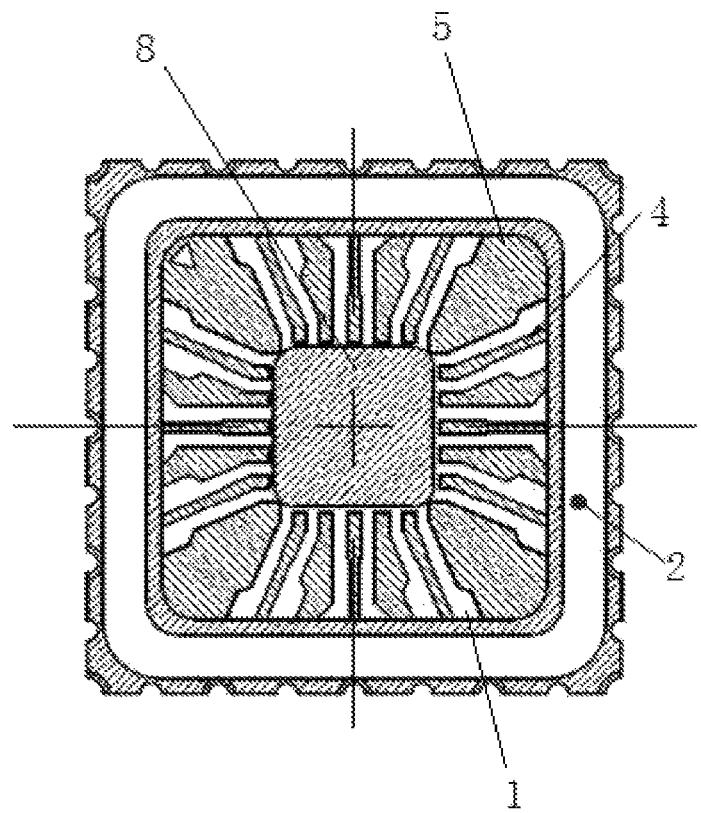
FIG. 1 illustrates a schematic structural of top view of the package described in this application.

In the drawings, the reference numerals are listed:

1—ceramic; 2—sealing ring; 3—second layer; 4—RF signal transmission line; 5—grounding line; 6—first layer; 7—third layer; 8—front grounding metal pattern; 9—back grounding metal pattern; 10—grounding terminal; 11—RF signal transmission pad; 12—metallized interconnection hole.

DETAILED DESCRIPTION

Combining with the drawings in the embodiments of the application, the technical solutions in the embodiments of the application are described clearly and completely. It is obvious that the described embodiments are only part of the embodiments of the application, not all of the embodiments. Based on the embodiments in the application, all other embodiments obtained by ordinary technicians in this field without making creative work belong to the protection scope of the application.

In the following description, a lot of specific details are elaborated to facilitate a full understanding of the application, but the application can also be implemented in other ways that are different from those described here. Technicians in this field can make similar popularization without violating the connotation of the application, so the application is not limited by the specific embodiments disclosed below.

Figure 2:
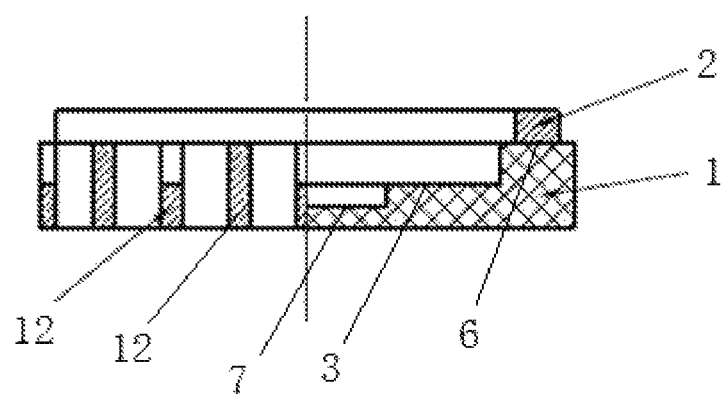
FIG. 2 illustrates a half cross-sectional schematic structural view of the package described in this application.
Figure 3:
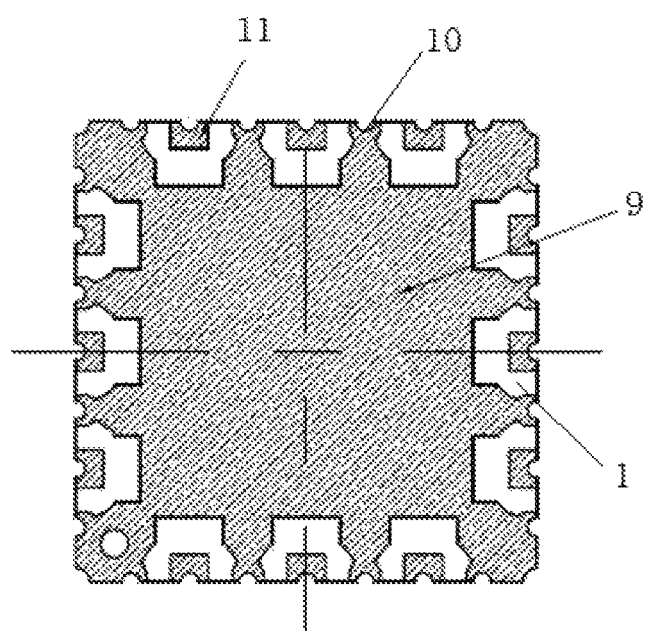
FIG. 3 illustrates a schematic structural of bottom view of the package described in this application.

As shown in FIGS. 1-3, the application discloses a high-frequency and high-speed and parallel seam welding leadless ceramic package, including: a ceramic 1, a sealing ring 2 and a metal cover plate; the ceramic and the sealing ring are welded by a metal solder, the sealing method between the metal cover plate and the package is parallel seam welding process. The ceramic 1 is a container structure with an opening at an upper end, and the ceramic, the sealing ring and the metal cover plate constitute a sealed cavity for providing airtight environmental protection and mechanical support for the internal integrated circuit. The upper surface of the ceramic 1 consists of three successive layers gradually decreasing height from outer to inner, namely the first to the third layers, in which the height of the first layer is the highest and the layer is annular; the height of the second layer is lower than that of the first layer, higher than that of the third layer, and the layer is annular; the height of the third layer is the lowest and the layer is rectangular. There are several RF signal transmission lines 4 in the second plane 3, and the RF signal transmission lines 4 are arranged in circular shape. Each RF signal transmission line 4 is provided with a grounding line 5 on each side, and the grounding line 5 is located on the first layer 6 and the second layer 3. The grounding lines on the first and second layers are interconnected through internal and/or external metallized interconnection holes.

The third layer 7 is provided with a front grounding metal pattern 8, the back surface of the ceramic 1 is provided with a back grounding metal pattern 9, the front grounding metal pattern 8 and the back grounding metal pattern 9 are interconnected by an internal or external metallized interconnection hole 12. The back grounding metal pattern 9 is provided with several outwardly protruding grounding terminals 10, and a RF signal transmission pad 11 is disposed between every two adjacent grounding terminals 10. The front grounding line 5 and the back grounding metal pattern 9 are interconnected by an internal or external metallized interconnection hole, and the RF signal transmission line 4 is interconnected with the RF signal transmission pad 11 by single external metallized interconnection hole or a combination of external metallized interconnection hole and internal metallized interconnection hole 12.

The RF signal transmission line 4 is located on the second layer 3 and configured to extend along the second layer 3 and pass through the ceramic 1 to the outer side of the ceramic 1. The RF signal transmission line 4 is interconnected (this interconnection is interconnected by an external metallized interconnection hole) with the RF signal transmission pad 11 by the metallized interconnection hole on the sidewall of the ceramic 1. In addition, preferably, the outer end portion of the grounding line 5, the outer end portion of the grounding terminal 10, and the outer end portion of the RF signal transmission pad 11 are located at an edge of the ceramic 1.

The ceramic of this type of package is square but not limited to a square, which is surrounded by signal transmission channels for RF transmission. The back surface of the ceramic is arranged with RF signal transmission pads and a large-area grounding metallized region, the metallized patterns of two surfaces of the ceramic are interconnected by internal metallized interconnection holes. Each RF transmission signal channel uses a coplanar waveguide transmission form to add more grounding hole to modulate the RF performance.

The ceramic of this package is an alumina ceramic, but not limited to alumina ceramics, but also aluminum nitride ceramics, LTCC ceramics and other ceramics, which are manufactured using multi-layer ceramic technology.

Figure 4:
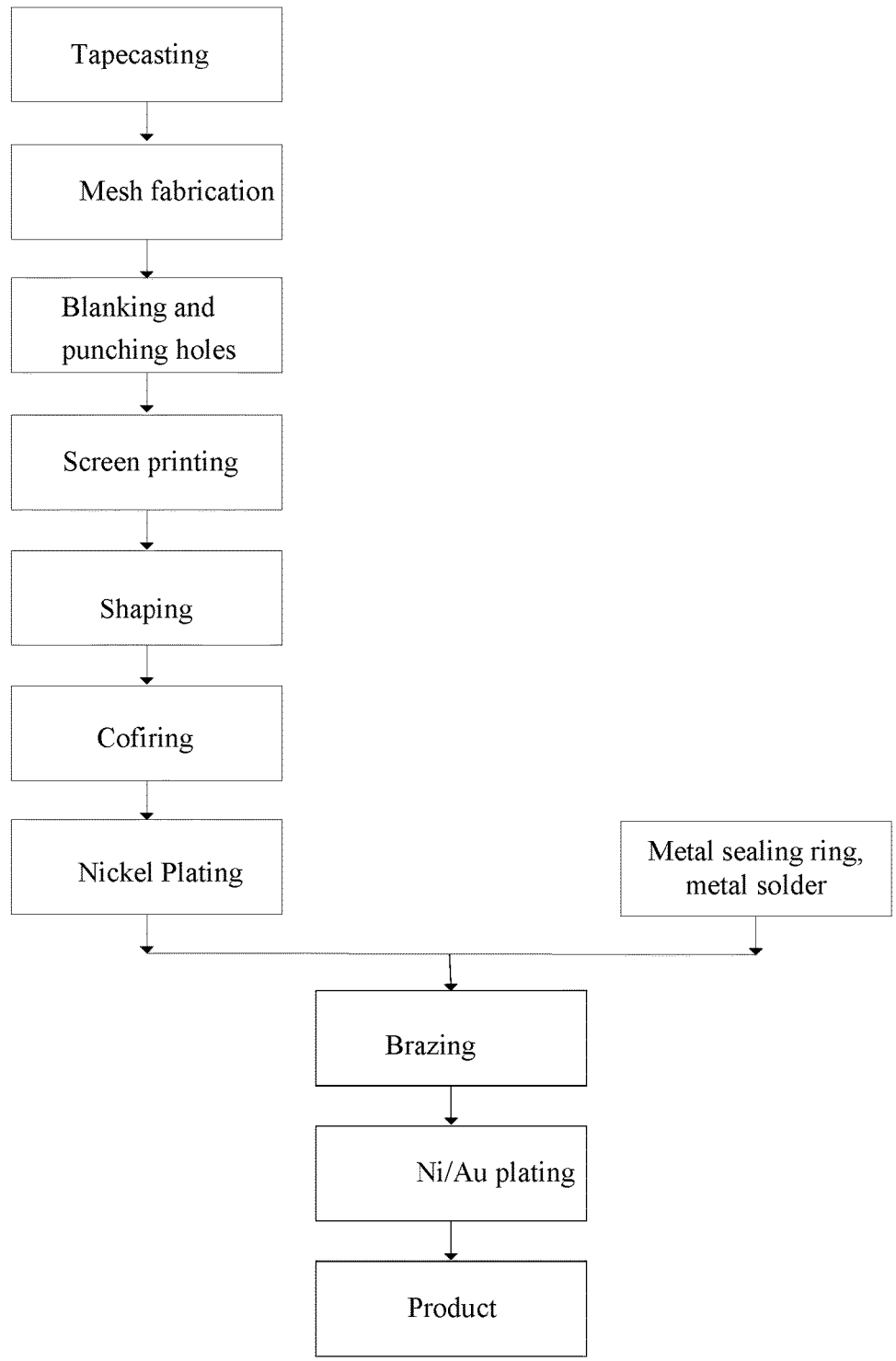
FIG. 4 illustrates flow chart of manufacturing process of the package described in this application.

The raw ceramic sheet is produced by a casting process, then a small hole and a desired cavity are processed on the raw ceramic by mechanical punching, laser drilling, or a mold, and then the tungsten paste or the molybdenum paste is filled in the small hole, and the conductive pastes of gold, silver, copper or the like can also be used. a metallized pattern is manufactured on a surface of the raw ceramic sheet using tungsten paste or the molybdenum paste, and also using conductive pastes such as gold, silver or copper, and the multilayer raw ceramic sheets are pressed together to form a raw ceramic array, then the raw ceramic array is cut into individual raw ceramic by cutting equipment, and then the raw ceramic is fired at a high temperature to obtain a ceramic. After nickel plating, welding with the metal sealing ring, gold plating on the surface to produce finished products. The process flow is shown in FIG. 4.

Compared to traditional ceramic quad flat non-leaded package, this type of package has the following significant advantages:

Through structural optimization, the side face transmission hole replaces part of the internal transmission hole, thereby the layout space of the inner core signal line, the signal hole and the transmission hole are increased, thereby more grounding holes can be added to modulate the RF performance, and the RF performance can be realized to cover the Ku-band completely, the return loss and insertion loss are low, the in-band flatness is good, and there are no resonance points, which is beneficial to the development of the integrated circuit to higher frequency and higher transmission rate.

In addition, by optimizing the structure and replacing part of internal solid transmission holes traces with side traces, the package wall thickness can be increased under the premise of ensuring excellent RF performance, the method of the parallel seam welding sealing package can be realized; compared with other sealing methods, the difficulty and cost of the sealing process is greatly reduced by realizing parallel seam welding, the production efficiency is improved, the high reliability and the high air tightness are ensured, and the batch application is facilitated.

What is claimed is:

1. A parallel seam welding leadless ceramic package, comprising: a ceramic (1), a sealing ring (2) and a metal cover plate;

wherein the ceramic (1) is a container structure with an opening at an upper end, the metal cover plate seals the opening of the upper end of the ceramic (1) via the sealing ring (2), wherein an upper surface of the ceramic (1) comprising a first layer, a second layer, and a third layer that are consecutive with heights gradually decreasing from the outside to the inside, the second layer is provided thereon with a plurality of RF signal transmission lines (4), and both sides of each of the RF signal transmission lines (4) are respectively provided with grounding lines (5), the grounding lines (5) are located on the first layer (6) and the second layer (3), and the grounding lines on the first layer and the second layer are interconnected by internal and/or external metallized interconnection holes, the third layer (7) is provided thereon with a front grounding metal pattern (8), a back surface of the ceramic (1) is provided with a back grounding metal pattern (9), and the back grounding metal pattern (9) is provided with several outwardly protruding grounding the grounding line, a RF signal transmission pad (11) is disposed between every two adjacent grounding terminals (10), the front grounding metal pattern (8) and the back grounding metal pattern (9) are interconnected by the internal and/or external metallized interconnection holes (12), terminals (10) (5) and the back grounding metal pattern (9) are interconnected by the internal or external metallized interconnection holes, and the RF signal transmission lines (4) are interconnected to the RF signal transmission pad (11) by separate external metallized interconnection holes or a combination of external metallized interconnection holes and internal metallized interconnection holes (12).

2. The parallel seam welding leadless ceramic package of claim 1, wherein the RF signal transmission lines (4) are located on the second layer (3) and configured to extend along the second layer (3) and pass through the ceramic (1) to an outside of the ceramic (1), and the plurality of RF signal transmission lines (4) are interconnected with the RF signal transmission pads (11) by the metallized interconnection hole (12) on a sidewall of the ceramic (1).

3. The parallel seam welding leadless ceramic package of claim 1, wherein: an outer end portion of the grounding line (5), an outer end of the grounding terminal (10), and an outer end of the RF signal transmission pad (11) are located at an edge of the ceramic (1).

4. The parallel seam welding leadless ceramic package of claim 1, wherein the ceramic (1) is an alumina ceramic, an aluminum nitride ceramic, or a low temperature co-fired ceramic.

5. The parallel seam welding leadless ceramic package of claim 1, wherein the sealing ring (2) and the ceramic (1) are welded by a parallel seam welding process, and the metal cover plate and the sealing ring (2) are welded by the parallel seam welding process.

6. The parallel seam welding leadless ceramic package of claim 1, wherein the package as a whole is rectangular.

* * * * *